(12) United States Patent
Morinaga et al.

(10) Patent No.: US 8,017,518 B2
(45) Date of Patent: Sep. 13, 2011

(54) METHOD FOR MANUFACTURING A SEMICONDUCTOR DEVICE

(75) Inventors: Yasunori Morinaga, Osaka (JP); Hideo Nakagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 229 days.

(21) Appl. No.: 12/341,495

(22) Filed: Dec. 22, 2008

(65) Prior Publication Data

US 2009/0170314 A1  Jul. 2, 2009

(30) Foreign Application Priority Data

Dec. 28, 2007 (JP) ................................. 2007-339766

(51) Int. Cl.
*H01L 21/00* (2006.01)
(52) U.S. Cl. ....................... 438/637; 438/639
(58) Field of Classification Search ........... 438/637–639
See application file for complete search history.

(56) References Cited

U.S. PATENT DOCUMENTS

| | | | |
|---|---|---|---|
| 2001/0019894 A1* | 9/2001 | Peng et al. | 438/689 |
| 2004/0013858 A1 | 1/2004 | Hacker et al. | |
| 2004/0152296 A1 | 8/2004 | Matz et al. | |
| 2006/0057855 A1 | 3/2006 | Ramos et al. | |
| 2006/0141641 A1 | 6/2006 | Fan et al. | |
| 2008/0057728 A1* | 3/2008 | Shimura et al. | 438/735 |

* cited by examiner

*Primary Examiner* — Richard A. Booth
(74) *Attorney, Agent, or Firm* — McDermott Will & Emery LLP

(57) ABSTRACT

A method for manufacturing a semiconductor device includes the steps of: (a) forming a low dielectric constant film over a semiconductor substrate; (b) forming a recess in the low dielectric constant film; (c) after the step (b), sequentially performing the steps of (c1) applying an organic solution to the low dielectric constant film and (c2) silylating the low dielectric constant film with a silylating solution; and (d) after the step (c), embedding a metal in the recess to form at least one of a via plug and a metal wiring in the low dielectric constant film. Performing the step (c1) before the step (c2) improves a penetration property of the silylating solution into the low dielectric constant film.

13 Claims, 10 Drawing Sheets

METHOD FOR MANUFACTURING A SEMICONDUCTOR DEVICE

CROSS-REFERENCE TO RELATED APPLICATIONS

This application claims priority from Japanese Patent Application No. 2007-339766 filed on Dec. 28, 2007, the disclosure of which application is hereby incorporated by reference into this application in its entirety for all purposes.

BACKGROUND OF THE INVENTION

Related Art

With dimensional reduction of LSI (Large Scale Integration), there has been a growing demand for further improvement in operation speed of semiconductor elements and further reduction in power consumption. In order to ensure reduction in both wiring resistance and wiring capacity in wiring formation, it has been considered to use copper (Cu) having a lower resistance than that of aluminum (Al) as a wiring material and to use a low dielectric constant insulating film having a lower relative dielectric constant k than that of a silicon oxide ($SiO_2$) film, that is, a so-called low dielectric constant film, as a material of an insulating film between wirings. Development of a low dielectric constant film made of a porous material has been accelerated in recent years in order to further reduce the dielectric constant.

A damascene method is generally used in Cu wiring formation. More specifically, after a recess is formed in a Cu diffusion preventing film and a low dielectric constant film formed thereon, a barrier metal thin film is formed by sputtering in the recess and Cu is then embedded thereon by plating. Excessive Cu on the low dielectric constant film and an upper part of the low dielectric constant film are then removed by CMP (Chemical Mechanical Polishing) to form a metal wiring of Cu.

There are various types of low dielectric constant film such as an organic film, an inorganic film, and a silicon oxide carbide (SiOC) film as an organic-inorganic hybrid film. A CVD (Chemical Vapor Deposition) method or an SOD (Spin On Dielectric) method can be used to manufacture these films. An example of the organic film is polyaryl and an example of the inorganic film is HSQ (Hydrogen Siloxane). The SiOC film is a $SiO_2$ film having a part of Si modified with an alkyl group such as a methyl group.

In the recess formation, dry etching is used, and ashing is then performed to remove an etching residue remaining in the low dielectric constant film. Moreover, cleaning is performed as necessary by using a cleaning solution. In general, when the dry etching, ashing, and cleaning processes are performed to form a recess in a low dielectric constant film, the surface of the low dielectric constant film and the inside structure of the low dielectric constant film are damaged in each process.

Especially when the low dielectric constant film is a SiOC film, two kinds of damages are generated. In other words, a skeleton of Si—O—Si is broken or partially removed and Si—$CH_3$ bond is broken. If the molecular structure at the inner surface of the fine pores of the low dielectric constant film and the molecular structure inside the low dielectric constant film are destroyed, a dangling bond remains at a terminal of a chemical bond. Such a dangling bond is replaced with a proton group, a hydroxyl (OH) group, or adsorption of water or a water cluster occurs. These phenomena cause degradation in breakdown characteristics of the low dielectric constant film and increase in dielectric constant, thereby adversely affecting capability of a semiconductor element.

In the case of SiOC films, such damages are generated in a SiOC dense film having a k value of about 3. However, the damages are more significant in a SiOC porous film (a film having pores) having a k value of less than 3. Although the damages may stop near a surface layer in the SiOC dense film, the damages occur not only in a surface layer but in the inside of the film in the case of the SiOC porous film.

In view of such a problem, a method for manufacturing a semiconductor device as shown in FIG. 10 has been proposed (e.g., see Japanese National Phase PCT Laid-Open Publication Nos. 2004-511896 and 2007-508691). FIG. 10 shows a process sequence according to a conventional method for manufacturing a semiconductor device. As shown in FIG. 10, in the conventional manufacturing method of a semiconductor device, a dual damascene method is performed and then a silylation process is performed. As a result, OH at the surface of a low dielectric constant film and OH within the low dielectric constant film react with a silylating agent and are terminated with an alkyl group. Damages of the low dielectric constant film can thus be recovered.

There has been a UV (ultraviolet (light)) cure or EB (Electron Beam) cure technology as a technology of improving the mechanical strength of a low dielectric constant film in a semiconductor manufacturing process. The UV cure is a technology of applying UV light to a film while heating a substrate and thereby facilitating recombination of a broken bond portion caused by heating of the substrate while breaking a part of the principal chain and side chains in the SiOC film. The EB cure is a technology of applying electron beams to a film while heating a substrate and thereby facilitating recombination of a broken bond portion caused by heating of the substrate while breaking a part of the principal chain and side chains in the SiOC film. In either case, three-dimensional crosslinking is facilitated by the recombination, whereby the mechanical strength is increased.

FIG. 11 shows a process sequence according to a conventional method for manufacturing a semiconductor device. As shown in FIG. 11, in the conventional method for manufacturing a semiconductor device, a low dielectric constant film is first formed on a semiconductor substrate and a reforming process such as UV cure or EB cure is then performed to improve the mechanical strength of the low dielectric constant film.

SUMMARY OF THE INVENTION

However, the conventional method for recovering the damages generated by formation of the recess has the following problems. In the case of a porous film having a pore diameter of about several nanometers or more, a silylating agent increasingly reacts with moisture in the pores. As a result, clotting of the silylating agent occurs where a water molecule cluster is present, thereby blocking the pores. As a result, the silylating agent cannot be supplied further into the pores. Moreover, in the case of a porous film having a pore diameter of less than about several nanometers, a water molecule cluster is less likely to enter the pores. The silylating agent is less likely to be supplied deep into the pores due to the small pore diameter, or the silylating agent cannot be supplied further into the pores when the silylating agent itself reacts with OH groups.

As described above, in the case of a porous film, damages in the pores of the film cannot be completely repaired even by the conventional silylation process.

Moreover, although the mechanical strength of the low dielectric constant film is improved by the cure process, the principal chain and side chains in the low dielectric constant film are broken by the cure process. Since not all of the broken part of the principal chain and the broken side chains are recombined, damages are generated in the low dielectric constant film. Like the damages generated by the recess formation, these damages can be generally repaired by the silylation process. However, the same problems as those described above occur in the case of a porous film having a pore diameter of about several nanometers or more.

In view of the above problems, it is an object of the present invention to provide a method for manufacturing a semiconductor device having a low dielectric constant film having excellent capability even if the low dielectric constant film is damaged during a manufacturing process.

In order to achieve the above object, a first method for manufacturing a semiconductor device includes the steps of: (a) forming a low dielectric constant film over a substrate; (b) forming a recess in the low dielectric constant film; (c) after the step (b), sequentially performing the steps of (c1) applying an organic solution to the low dielectric constant film and (c2) silylating the low dielectric constant film with a silylating solution; and (d) after the step (c), embedding a metal in the recess to form at least one of a via plug and a metal wiring in the low dielectric constant film.

According to this method, the silylating solution is supplied after the organic solution is applied to the low dielectric constant film in the step (c). This enables the silylating solution to penetrate into fine pores formed deep inside the low dielectric constant film. Accordingly, the low dielectric constant film can be more efficiently silylated as compared to the case where the organic solution is not applied. As a result, even if the low dielectric constant film is damaged during formation of the recess such as in the step (b), the film damages of the low dielectric constant film can be efficiently repaired in the step (c). A high quality low dielectric constant film can therefore be obtained. According to the first manufacturing method of the semiconductor device of the present invention, a low dielectric constant film having excellent capability is obtained, and the wiring resistance and the insulating film capacity are suppressed, thereby implementing a reliable semiconductor device capable of operating at a high speed even when the semiconductor device is reduced in dimensions.

According to a second manufacturing method of the semiconductor device of the present invention, the step (c2) of the first manufacturing method further includes the step of heating the substrate after applying the silylating solution to the low dielectric constant film. In this case, after the silylating solution penetrates into the fine pores formed deep inside the low dielectric constant film, a solvent of the silylating solution and an excess component that has not been silylated can be evaporated by the heating process. As a result, the semiconductor device manufactured by the method has improved reliability.

According to a third manufacturing method of the semiconductor device of the present invention, the step (c1) of the first manufacturing method further includes the step of heating the substrate after applying the organic solution to the low dielectric constant film. In this case, when the organic solution that has penetrated into the fine pores formed deep inside the low dielectric constant film is evaporated by heating, an unnecessary residual organic component and moisture remaining in the pores are also evaporated simultaneously. This enables the silylating solution to penetrate into the fine pores formed deep inside the low dielectric constant film in the following silylating step.

According to a fourth manufacturing method of the semiconductor device of the present invention, in the step (c) of the first manufacturing method, the step (c2) is performed before the organic solution applied in the step (c1) dries. This not only enables the silylating solution to more efficiently penetrate into the fine pores formed deep inside the low dielectric constant film, but also improves application uniformity of the silylating solution.

According to a fifth manufacturing method of the semiconductor device of the present invention, the step (b) is any one of etching, ashing, and cleaning. In this case, damages that are generated during processing of the low dielectric constant film can be effectively repaired, whereby capability of the insulating film is improved.

According to a sixth manufacturing method of the semiconductor device of the present invention, the organic solution is a solvent contained in the silylating solution or a solution which is soluble in the solvent contained in the silylating solution and which is chemically stable with a silylating agent. In this case, no unnecessary reaction occurs when the silylating solution is applied after application of the organic solution. The silylating solution therefore stably penetrates into the fine pores formed deep inside the low dielectric constant film, whereby silylation can be stably performed.

According to a seventh manufacturing method of the semiconductor device of the present invention, the organic solution contains at least one alcohol. In this case, when the alcohol penetrates into the fine pores formed deep inside the low dielectric constant film and is evaporated, an organic residue and moisture in the pores can also be removed simultaneously. As a result, the low dielectric constant film can be uniformly silylated in the following silylating step (c2).

According to an eighth manufacturing method of the semiconductor device of the present invention, the organic solution is isopropyl alcohol or a solution containing at least isopropyl alcohol. In this case, the organic solution has an excellent penetration property into the fine pores formed deep inside the low dielectric constant film. Moreover, in the case where heating is performed after the organic solution is applied, an unnecessary residual organic component and moisture remaining in the pores can be efficiently evaporated simultaneously with the organic solution.

According to a ninth manufacturing method of the semiconductor device of the present invention, the organic solution is made by using at least one of ketones, ethers, esters, and hydrocarbons. In this case, a combination of the organic solution and the silylating solution having an excellent affinity can be implemented. The silylating agent can therefore be made to penetrate into the fine pores formed deep inside the low dielectric constant film through a solvent. The low dielectric constant film can therefore be uniformly silylated.

According to a tenth manufacturing method of the semiconductor device of the present invention, the step (a) includes the steps of (a1) forming a first low dielectric constant film over the substrate and (a2) forming a second low dielectric constant film over the first low dielectric constant film. The step (b) includes the steps of (b1) forming a part of the recess in the first low dielectric constant film and (b2) forming another part of the recess in the second low dielectric constant film. The step (d) includes the steps of (d1), before the step (a2), embedding a metal in the part of the recess formed in the step (b1) to form the via plug in the first low dielectric constant film and (d2) embedding a metal in the part of the recess formed in the step (b2) to form the metal wiring in the second low dielectric constant film, thereby forming a wiring of a layer. The step (c) is performed after at least one of the steps (b1) and (b2).

In this case, even when one of the first low dielectric constant film and the second dielectric constant film is a porous film or both of them are porous films, damages generated during processing of the films can be effectively repaired. As a result, a low dielectric film having excellent capability is obtained and the wiring resistance and the insulating film capacity are suppressed, thereby implementing a reliable semiconductor device capable of operating at a high speed even when the semiconductor device is reduced in dimensions.

According to an eleventh manufacturing method of the semiconductor device of the present invention, the recess formed in the low dielectric constant film is formed by a via hole and a wiring groove connecting to the via hole, the via plug and the metal wiring are simultaneously formed by embedding a metal in the recess, and the step (c) is performed after at least one of etching, ashing, and cleaning performed to form the recess.

In this case, damages that are generated during formation of the recess in the low dielectric constant film can be effectively repaired, whereby capability of the insulating film is improved. As a result, a low dielectric film having excellent capability is obtained and the wiring resistance and the insulating film capacity are suppressed, thereby implementing a reliable semiconductor device having a dual damascene wiring and capable of operating at a high speed even when the semiconductor device is reduced in dimensions.

A twelfth method for manufacturing a semiconductor device of the present invention includes the steps of: (a) forming a low dielectric constant film over a substrate; (b) applying light or electron beams to the low dielectric constant film; and (c) after the step (b), sequentially performing the steps of (c1) applying an organic solution to the low dielectric constant film and (c2) silylating the low dielectric constant film with a silylating solution.

According to this method, mechanical strength of the low dielectric constant film can be increased by applying light or electron beams to the low dielectric constant film. Accordingly, a high speed, reliable semiconductor device having a high-strength low dielectric constant film can be manufactured. Moreover, the silylating solution is supplied after the organic solution is applied to the low dielectric constant film in the step (c). This enables the silylating solution to penetrate into fine pores formed deep inside the low dielectric constant film. Accordingly, the low dielectric constant film can be more efficiently silylated as compared to the case where the organic solution is not applied. As a result, even if the low dielectric constant film is damaged by application of light or electron beams in the step (b), the film damages of the low dielectric constant film can be efficiently repaired in the step (c). A high quality low dielectric constant film can therefore be obtained. According to the twelfth manufacturing method of the semiconductor device of the present invention, a high-strength low dielectric constant film having excellent capability is obtained, and the wiring resistance and the insulating film capacity are suppressed, thereby implementing a reliable semiconductor device capable of operating at a high speed even when the semiconductor device is reduced in dimensions.

According to a thirteenth manufacturing method of the semiconductor device of the present invention, the light applied to the low dielectric constant film in the step (b) includes a short wavelength component having a wavelength equal to or less than that of ultraviolet light. In this case, the mechanical strength of the low dielectric constant film can be further increased, but at the same time, damages to the low dielectric constant film are also increased. However, since the manufacturing method of the semiconductor device of the present invention includes the silylating step (c), the damages to the low dielectric constant film can be easily repaired. As a result, a high speed, reliable semiconductor device having a high-strength low dielectric constant film with a high breakdown property can be manufactured.

According to a fourteenth manufacturing method of the semiconductor device of the present invention, the step (c2) of the first manufacturing method further includes the step of heating the substrate after applying the silylating solution to the low dielectric constant film. In this case, after the silylating solution penetrates into the fine pores formed deep inside the low dielectric constant film, a solvent of the silylating solution and an excess component that has not been silylated can be evaporated by the heating process. As a result, the semiconductor device manufactured by the method has improved reliability.

According to a fifteenth manufacturing method of the semiconductor device of the present invention, the step (c1) of the first manufacturing method further includes the step of heating the substrate after applying the organic solution to the low dielectric constant film. In this case, when the organic solution that has penetrated into the fine pores formed deep inside the low dielectric constant film is evaporated by heating, an unnecessary residual organic component and moisture remaining in the pores are also evaporated simultaneously. This enables the silylating solution to penetrate into the fine pores formed deep inside the low dielectric constant film in the following silylating step.

According to a sixteenth manufacturing method of the semiconductor device of the present invention, in the step (c) of the first manufacturing method, the step (c2) is performed before the organic solution applied in the step (c1) dries. This not only enables the silylating solution to more efficiently penetrate into the fine pores formed deep inside the low dielectric constant film, but also improves application uniformity of the silylating solution.

According to a seventeenth manufacturing method of the semiconductor device of the present invention, the step (b) is any one of etching, ashing, and cleaning. In this case, damages that are generated during processing of the low dielectric constant film can be effectively repaired, whereby capability of the insulating film is improved.

According to an eighteenth manufacturing method of the semiconductor device of the present invention, the organic solution is a solvent contained in the silylating solution or a solution which is soluble in the solvent contained in the silylating solution and which is chemically stable with a silylating agent. In this case, no unnecessary reaction occurs when the silylating solution is applied after application of the organic solution. The silylating solution therefore stably penetrates into the fine pores formed deep inside the low dielectric constant film, whereby silylation can be stably performed.

According to a nineteenth manufacturing method of the semiconductor device of the present invention, the organic solution contains at least one alcohol. In this case, when the alcohol penetrates into the fine pores formed deep inside the low dielectric constant film and is evaporated, an organic residue and moisture in the pores can also be removed simultaneously. As a result, the low dielectric constant film can be uniformly silylated in the following silylating step (c2).

According to a twentieth manufacturing method of the semiconductor device of the present invention, the organic solution is isopropyl alcohol or a solution containing at least isopropyl alcohol. In this case, the organic solution has an excellent penetration property into the fine pores formed deep inside the low dielectric constant film. Moreover, in the case where heating is performed after the organic solution is applied, an unnecessary residual organic component and moisture remaining in the pores can be efficiently evaporated simultaneously with the organic solution.

According to a twenty-first manufacturing method of the semiconductor device of the present invention, the organic solution is made by using at least one of ketones, ethers, esters, and hydrocarbons. In this case, a combination of the organic solution and the silylating solution having an excellent affinity can be implemented. The silylating agent can therefore be made to penetrate into the fine pores formed deep inside the low dielectric constant film through a solvent. The low dielectric constant film can therefore be uniformly silylated.

A twenty-second manufacturing method of the semiconductor device of the present invention further includes the step of (d) after the step (c), forming a recess in the low dielectric constant film and embedding a metal in the recess to form at least one of a via plug and a metal wiring. In this case, since the low dielectric constant film is silylated before being processed, damages that are conventionally generated by formation of a recess in the low dielectric constant film can be suppressed.

A twenty-third manufacturing method of the semiconductor device of the present invention further includes the step of after the step (c), forming in the low dielectric constant film a recess formed by a via hole and a wiring groove connecting to the via hole, and embedding a metal in the recess to simultaneously form a via plug and a metal wiring. In this case, since the low dielectric constant film is silylated before being processed, damages that are conventionally generated by formation of a recess in the low dielectric constant film can be suppressed. As a result, a high-strength low dielectric film having excellent capability is obtained and the wiring resistance and the insulating film capacity are suppressed, thereby implementing a reliable semiconductor device having a dual damascene wiring and capable of operating at a high speed even when the semiconductor device is reduced in dimensions.

DETAILED DESCRIPTION OF THE PREFERRED EMBODIMENTS

First Embodiment

Figure 1:
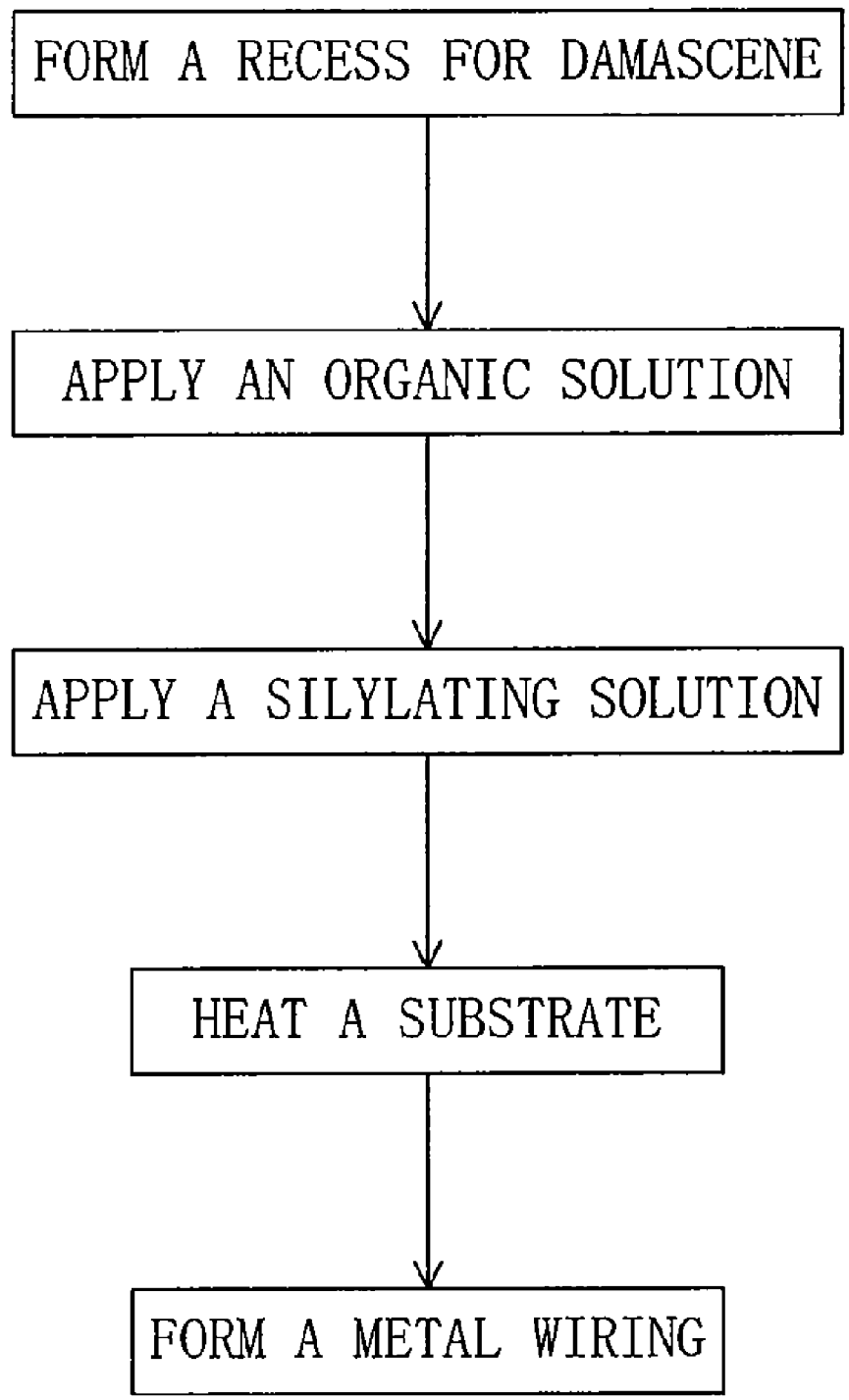
FIG. 1 shows a process sequence according to a method for manufacturing a semiconductor device according to a first embodiment of the present invention.

Hereinafter, a method for manufacturing a semiconductor device according to a first embodiment of the present invention will be described with reference to the figures. FIG. 1 shows a process sequence according to the method for manufacturing a semiconductor device according to the first embodiment. FIGS. 2A through 2F are diagrams illustrating the method for manufacturing a semiconductor device according to the first embodiment. In the first embodiment, description is given to the case where a multilayer wiring structure made of, for example, Cu is formed by using a dual damascene method.

Figure 2A:
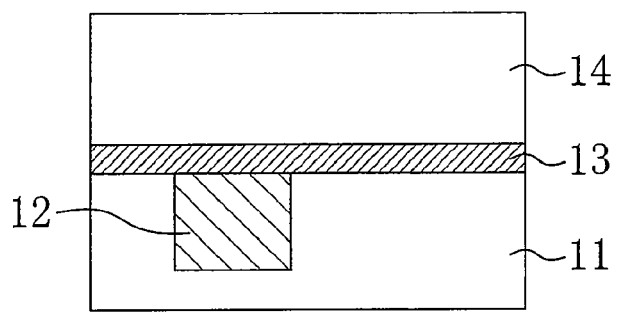
FIGS. 2A, 2B, 2C, 2D, 2E, and 2F are diagrams illustrating the method for manufacturing a semiconductor device according to the first embodiment of the present invention.

First, as shown in FIGS. 1 and 2A, an interlayer insulating film 11 having a wiring groove is formed over a semiconductor substrate (not shown) having required semiconductor elements formed thereon. The interlayer insulating film 11 is made of, for example, an NSG (Non Silicate Glass) film which is a thermal oxide film. A lower wiring 12 of, for example, Cu is formed by embedding Cu in the wiring groove.

An etching stopper layer 13 is then formed over the interlayer insulating film 11. The etching stopper layer 13 is made of, for example, silicon carbide (SiC). In practice, the etching stopper layer 13 made of a silicon carbide oxide/silicon carbide nitride (SiCO/SiCN) layered film instead of SiC is more preferable because an adhesion property and a Cu diffusion preventing property are improved. However, the etching stopper layer 13 may be made of any other film or layered film having the same capability.

A low dielectric constant insulating film (low dielectric constant film) 14 is then formed on the etching stopper film 13. It is herein assumed that the low dielectric constant film 14 is a porous SiOC film. The low dielectric constant film 14 having a k value of, for example, 2.7 or less is preferable because this film is a porous film having pores. A k value of 2.5 or less is more preferred because wiring delay can be improved. A low dielectric constant film having a k value of about 2.7 or less is therefore preferably used. A CVD method and a SOD method are generally convenient to manufacture such a low dielectric constant film. However, the same effect as that of the manufacturing method of the semiconductor device of the present embodiment can be obtained even if the low dielectric constant film 14 is formed by another method. Note that the low dielectric constant film 14 may be any film as long as it is a porous film. However, even if the low dielectric constant film 14 is another organic film or inorganic film, damages are likely to be generated by processing, and the manufacturing method of the present invention is also applicable to and effective for the organic film or inorganic film.

The low dielectric constant film 14 is then reformed by applying UV beams or electron beams to the semiconductor substrate. This process increases the mechanical strength of the low dielectric constant film 14.

Figure 2D:
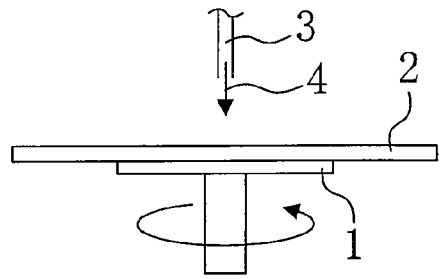
Figure 2B:
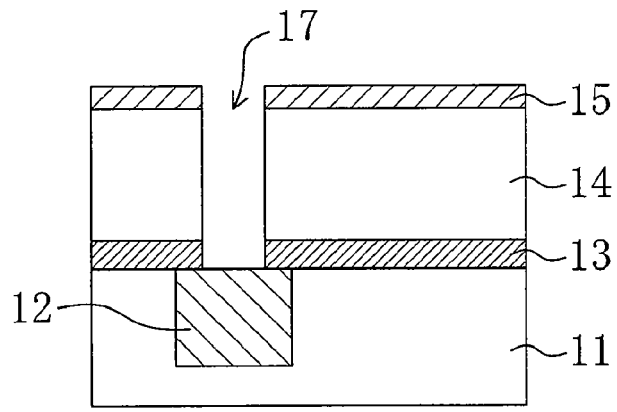

As shown in FIG. 2B, a cap film 15 is the formed on the low dielectric constant film 14. The cap film has various functions. For example, the cap film protects the low dielectric constant film 14 during processing and is used as a hard mask. Moreover, in a CMP process described below, a part of the cap film 15 is left to protect the low dielectric constant film 14 from a chemical agent used in the CMP. Any film that satisfies these conditions can therefore be used as the cap film 15. For example, a $SiO_2$ film such as NSG and TEOS (Tetra Ethyl Ortho Silicate), SiC, SiN (silicon nitride), SiOC, SiOCN (silicon oxycarbonitride), SiCO, SiCON (silicon-carbon-oxy-nitride), or a layered film of any combination of these films may be used.

A resist pattern (not shown) for forming a via hole is then formed by lithography on the cap film 15. By using the resist pattern as a mask, etching is performed to form a via hole 17 extending through the cap film 15 and the low dielectric constant film 14. A resist (not shown) is then embedded in the via hole 17 and etch-back is performed so that the resist (not shown) remains in a lower part of the via hole 17.

A resist pattern (not shown) for forming a trench groove 18 is then formed. Etching is performed by using the resist pattern as a mask, whereby the trench groove 18 connected to the via hole 17 is formed in an upper part of the low dielectric constant film 14. The resist pattern and the resist and the etching stopper film 13 in the via hole 17 are then removed. Thereafter, a predetermined process such as ashing and cleaning is performed to expose the top surface of the lower wiring 12 as shown in FIG. 2C. A recess 20 formed by the via hole 17 and the trench 18 can thus be formed in the low dielectric constant film 14.

By the etching and ashing performed in the process of forming the recess 20 shown in FIGS. 2B and 2C, Si—$CH_3$ (methyl groups) of side chains or Si—O bond of the principal chain are broken at the surface of the low dielectric constant film 14 and the pore surface within the low dielectric constant film 14. As a result, the low dielectric constant film 14 has a portion in which a chemical bond becomes a dangling bond without being terminated, a portion replaced with a hydrogen group, and a portion in which a hydrogen group is replaced with a hydroxyl group by reaction with moisture, causing significant increase in effective k value of the low dielectric constant film 14. Moreover, a cleaning solution used in the cleaning process acts on the surface and the pore surface of the low dielectric constant film 14 that has been damaged by the etching and ashing processes. As a result, methyl groups are removed from the low dielectric constant film 14, generating a portion terminated with a hydroxyl group and a portion that has adsorbed a water cluster and water molecules. Moreover, Si—O bond of the principal chain is broken, whereby the mechanical strength is reduced. During storage of the semiconductor substrate after the etching, ashing, and cleaning processes, moisture may be naturally absorbed, whereby hydroxyl groups, water clusters, and water molecules bonding with dangling bonds may increase in the pores of the low dielectric constant film 14. If the low dielectric constant film 14 is thus damaged, the damaged portion may serve as a charge trapping site or as a current leakage path between wirings during actual operation of a semiconductor device. As a result, capability of the semiconductor device is significantly degraded.

Figure 2E:
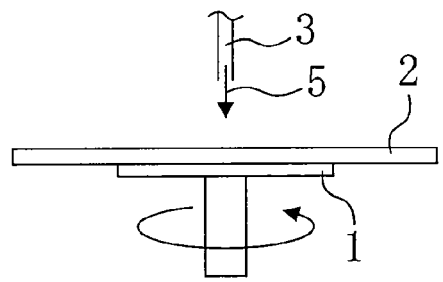
Figure 2C:
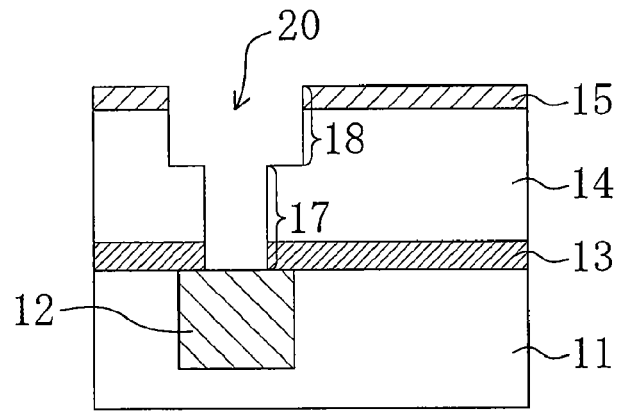
Figure 2F:
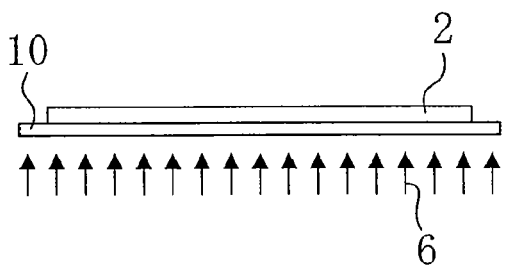

In view of the above problem, a "damage recovering process" as shown in FIGS. 2D through 2F is performed in the manufacturing method of the semiconductor device of the present embodiment. First, after the recess 20 is formed in the low dielectric constant film 14, an organic solution 4 is applied to the low dielectric constant film 14 as shown in FIG. 2D. More specifically, the semiconductor substrate 2 obtained in the step of FIG. 2C is placed on a spindle 1 and the organic solution 4 is supplied from a nozzle 3 while rotating the semiconductor substrate 2. For example, in the case of a 300-mm diameter wafer, the spindle 1 can be rotated at about 1,000 rpm to about 2,500 rpm.

As shown in FIG. 2E, a silylating solution 5 is then supplied to the low dielectric constant film 14 while rotating the semiconductor substrate 2. In the case as well, the spindle 1 can be rotated at about 1,000 rpm to about 2,500 rpm for a 300-mm diameter wafer. As a result, the silylating solution 5 acts on Si—OH at the surface of the low dielectric constant film 14 and Si—OH inside the low dielectric constant film 14. Hydroxyl groups of the low dielectric constant film 14 are attached by the silylating agent to produce siloxane bonds. For example, Si—OH is replaced with Si—O—$(Si(CH_3)_2$—$O)_n$. Siloxane may be either linear or branched. Siloxane may be cyclic as a whole or may have a cyclic structure. Since the hydroxyl groups which are the damages of the low dielectric constant film 14 generated in the above processes can thus be removed, the damages can be recovered. The surface of the low dielectric constant film 14 and the inside of the low dielectric constant film 14 are thus sufficiently silylated in this process.

As shown in FIG. 2F, the semiconductor substrate 2 is then placed on a hot plate 10 to perform heat treatment. Heat 6 is applied to the semiconductor substrate 2 from beneath in the temperature range from around the boiling point of the silylating solution to 450° C. which is an upper limit of a normal heat treatment temperature of the semiconductor substrate. The low dielectric constant film 14 can thus be more reliably silylated even if the silylating agent has poor reactivity. At the same time, an excessive silylating agent and a solvent of the silylating solution can be completely evaporated.

Note that two-step processing may be performed according to the vapor pressure of the solvent of the silylating solution. In other words, a silylation reaction may be caused by the heat treatment of the above process in a first step, and the solvent of the silylating solution may be evaporated in a second step. Multi-step processing may be performed by changing the heat treatment temperature in two or more steps.

Note that the temperature of the heat treatment that is finally performed in this process may be set to any value of about 150° C. or higher. In general, 180° C. or higher is more preferable to facilitate the reaction. The upper limit of the heating temperature may be any value of about 450° C. or less so as not to exceed a thermal budget of the manufacturing process. More strictly, an optimal temperature and an optimal processing time can be determined within the above temperature range so as to control the reaction speed in view of the reactivity and the boiling point of the silylating agent. The heat treatment time is preferably several minutes or less from the standpoint of the production cost of the semiconductor device. Even in this case, silylation is sufficiently facilitated.

Although not shown in the figures, a barrier metal film made of, for example, a layered film of tantalum (Ta) and tantalum nitride (TaN) is formed in the recess 20 by a sputtering method. A Cu seed film, for example, is then formed on the barrier metal film by a sputtering method, and Cu is formed by a plating method. Note that the barrier metal film and the Cu seed film may be formed by a CVD method or an ALD (Atomic Layer Deposition) method instead of the sputtering method.

Planarization is then performed by a CMP process to remove the Cu film formed outside the recess 20. A via plug and an upper wiring which are made of the Cu film and the barrier film and electrically connected to the lower wiring 12 can thus be simultaneously formed.

Note that, in the manufacturing method of the semiconductor device of the present embodiment, Cu is used as a material of the metal wiring. However, the present invention is not limited to this and any metal whose resistance is the same as or lower than that of Cu may be used. For example, gold (Au), silver (Ag), platinum (Pt) or the like may be used. The semiconductor device of the present embodiment can be manufactured by further performing a predetermined process.

The manufacturing method of the semiconductor device of the present embodiment is characterized in that, in the damage recovering process, the organic solution 4 is supplied to the low dielectric constant film 14 before the low dielectric constant film 14 is silylated. As described above, film damages are recovered by replacing a terminal portion of the low dielectric constant film 14 with a part of the silylating agent by silylation. The low dielectric constant film 14 has a reduced k value because the low dielectric constant film 14 is made of a porous film. If the pore diameter is reduced to about 2 to 3 nm or less, the silylating solution 5 is less likely to reach the pores in the low dielectric constant film 14, hindering effective silylation. In the manufacturing method of the semiconductor device of the present embodiment, the organic solution 4 is supplied to the low dielectric constant film 14 before silylation of the low dielectric constant film 14 so that the silylating solution 5 can reach the fine pores in the low dielectric constant film 14. Silylation can thus be more efficiently performed as compared to the case where the organic solution 4 is not supplied. As a result, a high quality low dielectric constant film with suppressed film damages is obtained and the wiring resistance and the insulating film capacity are suppressed, thereby implementing a reliable semiconductor device capable of operating at a high speed even when the semiconductor device is reduced in dimensions.

Figure 3A:
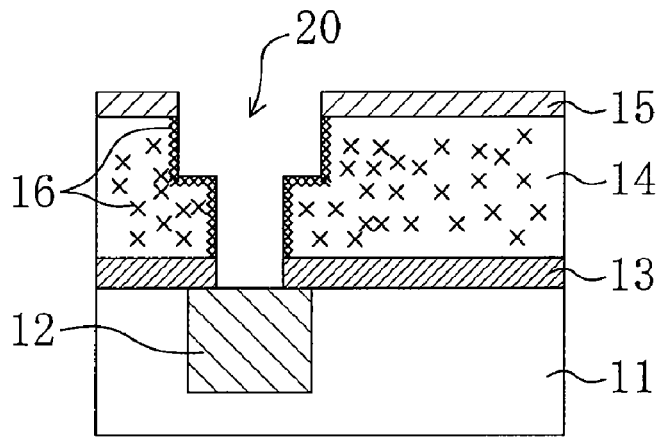
FIGS. 3A, 3B, and 3C are cross-sectional views showing effects of the method for manufacturing a semiconductor device according to the first embodiment of the present invention.
Figure 3B:
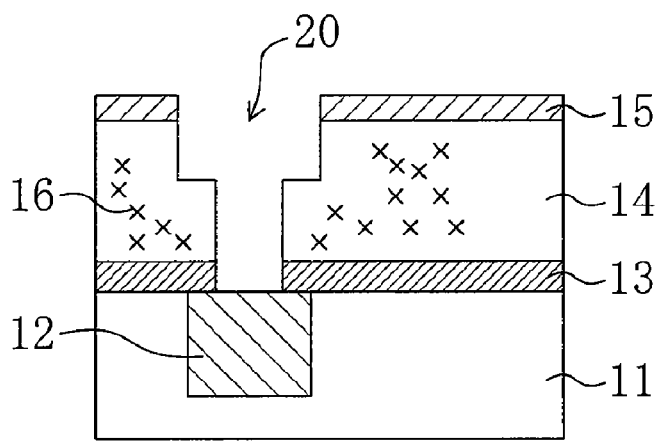
Figure 3C:
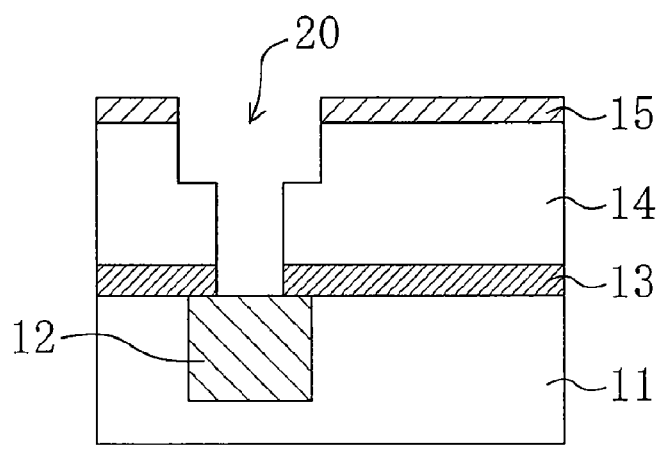

FIGS. 3A through 3C are cross-sectional views showing effects of the manufacturing method of the semiconductor device of the present embodiment. FIG. 3A is a cross-sectional view of the low dielectric constant film 14 after formation of the recess 20 (see FIG. 2C). FIG. 3B is a cross-sectional view of the low dielectric constant film 14 after silylation of supplying a silylating solution and heating is performed after the step of FIG. 2C. FIG. 3C is a cross-sectional view of the low dielectric constant film 14 after the damage recovering process of the present embodiment is performed after the step of FIG. 2C. As shown in FIG. 3A, after formation of the recess 20C, film damages 16 have been generated at the surface of the recess 20 and within the low dielectric constant film 14 by the etching and ashing processes. In the case where only the silylation is performed on the low dielectric constant film 14, the film damages 16 at the surface of the recess 20 are significantly recovered, but the film damages 16 inside the low dielectric constant film 14 still remain as shown in FIG. 3B. In the damage recovering process according to the manufacturing method of the semiconductor device of the present invention, the organic solution 4 is supplied in advance so that the silylating agent can penetrate into the low dielectric constant film 14. The film damages in the low dielectric constant film 14 can therefore be more reliably recovered as shown in FIG. 3C.

Note that, in the manufacturing method of the semiconductor device of the present embodiment, a solution made of at least a silylating agent and a solvent may be used as the silylating solution 5. A solution that is reactive with Si—OH can be used as the silylating agent. More specifically, a material that is reactive with Si—OH can be selected from silanes such as alkylsilane and alkylalkoxysilane, silane derivatives, and substances having a silazane bond.

Specific examples of the silylating agent are listed below. For example, the following materials can be used as the silylating agent: hexamethyldisilazane (HMDS), trimethylsilyldimethylamine (TMSDMA), acetoxytrimethylsilane, acetoxysilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, 2-trimethylsiloxypent-2-en-4-on, n-(trimethylsilyl)acetamide, 2-(trimethylsilyl)acetic acid, n-(trimethylsilyl)imidazole, trimethylsilyl(trimethylsiloxane)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, and trichlorosilane.

Note that the above silylating agents may be used in combination. The present invention is not limited to the above silylating agents. Another silylating agent may be used as the silylation proceeds.

In the case where the organic solution in the low dielectric constant film is evaporated between the organic solution applying step of FIG. 2D and the silylating solution applying step of FIG. 2E, one or more materials selected from, for example, alcohols, ketones, ethers, esters, and hydrocarbons may be used as the organic solution.

Figure 4:
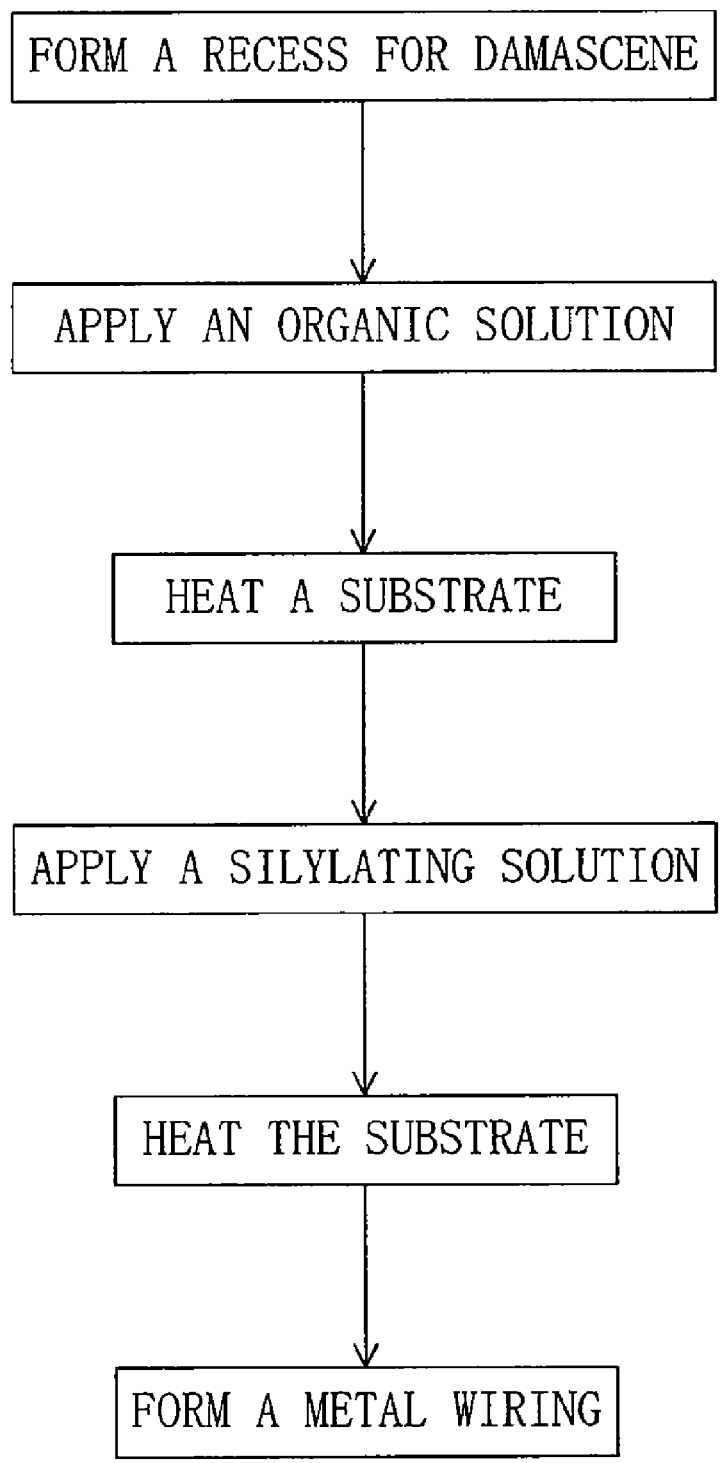
FIG. 4 shows a process sequence according to a modification of the method for manufacturing a semiconductor device according to the first embodiment of the present invention.
Figure 5A:
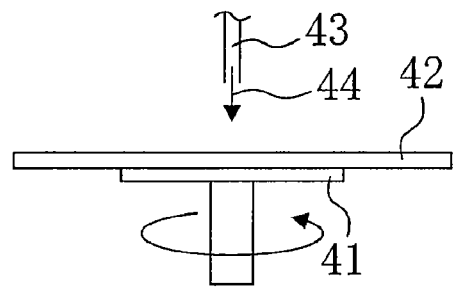
FIGS. 5A, 5B, 5C, and 5D are diagrams illustrating the modification of the method for manufacturing a semiconductor device according to the first embodiment of the present invention.
Figure 5B:
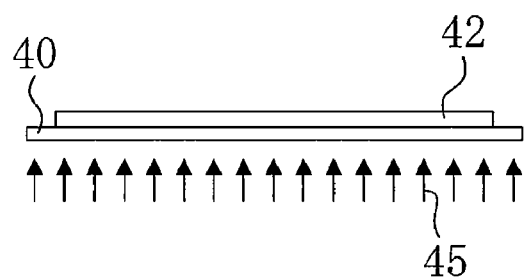
Figure 5C:
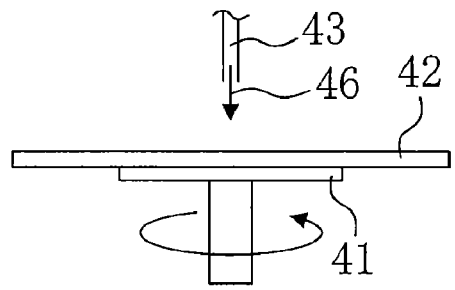
Figure 5D:
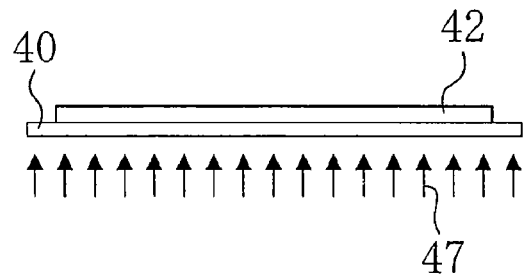

In the manufacturing method of the semiconductor device of the present embodiment, a rotation drying step may be added between the organic solution applying step of FIG. 2D and the silylating solution applying step of FIG. 2E. In this case, the silylating solution can be easily applied after the organic solution in the low dielectric constant film is evaporated. In order to more reliably evaporate the organic solution, a heating step may be added after the organic solution is applied to the low dielectric constant film. This process sequence is shown in FIG. 4. FIG. 4 shows a process sequence according to a modification of the manufacturing method of the semiconductor device of the present embodiment. FIGS. 5A through 5D are diagrams illustrating the modification of the manufacturing method of the semiconductor device of the present embodiment. As shown in FIGS. 5A through 5D, the modification of the manufacturing method of the semiconductor device of the present embodiment is characterized in that the heating step shown in FIG. 5B is added between the organic solution applying step of FIG. 5A and the silylating solution applying step of FIG. 5C.

In the modification of the manufacturing method of the semiconductor device of the present embodiment, a residual organic substance and moisture in the pores are also evaporated when the organic solution in the pores of the low dielectric constant film is evaporated in both the rotation drying step and the heating step. Accordingly, in the subsequent step of applying the silylating solution, the silylating solution can penetrate into the fine pores formed deep inside the low dielectric constant film without being hindered by the moisture and the residue in the pores. For example, isopropyl alcohol or a solution containing at least isopropyl alcohol is easy to handle and has an excellent penetration property into the fine pores formed deep inside the low dielectric constant film. In the case where the substrate is heated after application of the organic solution, an unnecessary residual organic component and moisture remaining in the pores can also be efficiently evaporated simultaneously. According to the modification of the manufacturing method of the semiconductor device of the present embodiment, a low dielectric constant film with excellent capability is obtained and the wiring resistance and the insulating film capacity are suppressed, thereby implementing a reliable semiconductor device capable of operating at a high speed even when the semiconductor device is reduced in dimensions.

Description will now be given to the case where the silylating solution applying step of FIG. 2E is performed before the organic solution applied in the organic solution applying step of FIG. 2D dries in the manufacturing method of the semiconductor device of the present embodiment. In this case, the silylating solution is applied to the substrate surface having the organic solution thereon, the silylating agent in the silylating solution penetrates into the fine pores formed deep inside the low dielectric constant film in the mixed state of the organic solution and the silylating solution. According to the manufacturing method of the semiconductor device of the present embodiment, a low dielectric constant film with excellent capability is obtained and the wiring resistance and the insulating film capacity are suppressed, thereby implementing a reliable semiconductor device capable of operating at a high speed even when the semiconductor device is reduced in dimensions.

In this case, the organic solution 4 has a function to assist penetration of the silylating solution 5 into the pores so that the silylating solution 5 can efficiently reach the fine pores of the low dielectric constant film 14. It is therefore desirable to use a solvent contained in the silylating solution 5 or a chemically stable solution that is soluble in this solvent and is not reactive with the silylating agent as the organic solution 4. In this case, it is desirable to use at least one selected from ketones, ethers, esters, and hydrocarbons as the solvent of the silylating solution.

Note that alcohols used as the solvent of the silylating solution may be, for example, methanol, ethanol, isopropyl alcohol, n-butanol, isobutanol, 2-ethylhexanol, and phenol. Ketones include dimethylketone, methyl ethyl ketone, methyl isobutyl ketone, diethyl ketone, 2-heptanone, ethylene oxide, cyclohexanone, and butyrolactone. Ethers include ethylene glycol monomethyl ether, ethylene glycol monoethyl ether, and tetrahydrofuran. Esters include methyl acetate, ethyl acetate, butyl acetate, and ethyl acetoacetate. Hydrocarbons include benzene, toluene, butene-1, xylene, styrene, isoprene, 1,3,5-trimethylbenzene, coal tar naphtha, n-pentane, n-hexane, isohexane, n-heptane, n-nonane, n-octane, n-dodecane, 2-methylbutane, hexadecane, tridecane, pentadecane, cyclopentane, 2,2,4-trimethylpentane, 1,2-dimethylbenzene, 1,2, 4-trimethylbenzene, isobutylbenzene, methylnaphthalene, ethyltoluene, and ligroin. The present invention is not limited to these materials and other organic solutions may be used. A solvent made of any combination of the above materials may be used.

In the manufacturing method of the semiconductor device of the present embodiment, the process of supplying the organic solution 4 and performing silylation (damage recovering process) is performed after the recess 20 is formed in the low dielectric constant film 14. However, the present invention is not limited to this. For example, the damage recovering process may be performed during formation of the recess 20, more specifically, after the via hole 17 is formed as shown in FIG. 2B. In this case, the film damages of the low dielectric constant film 14 generated by the etching, ashing, and cleaning processes in the step of forming the via hole 17 can be efficiently repaired. In the case where the damage recovering process is performed after formation of the via hole 17, the damage recovering process may be performed again after formation of the trench 18 (recess 20) as shown in FIGS. 2D through 2F. As a result, the film damages generated in the step of forming the trench 18 can be repaired, whereby the low dielectric constant film 14 having further suppressed damages can be obtained. The damage recovering process may be performed, for example, after each of the etching, ashing, and cleaning processes during formation of the via hole 17 and the trench 18. Performing the damage recovering process a plurality of times enables reliable recovery of the film damages generated in each process, whereby a semiconductor device having a high quality low dielectric constant film 14 can be manufactured.

Second Embodiment

Figure 6A:
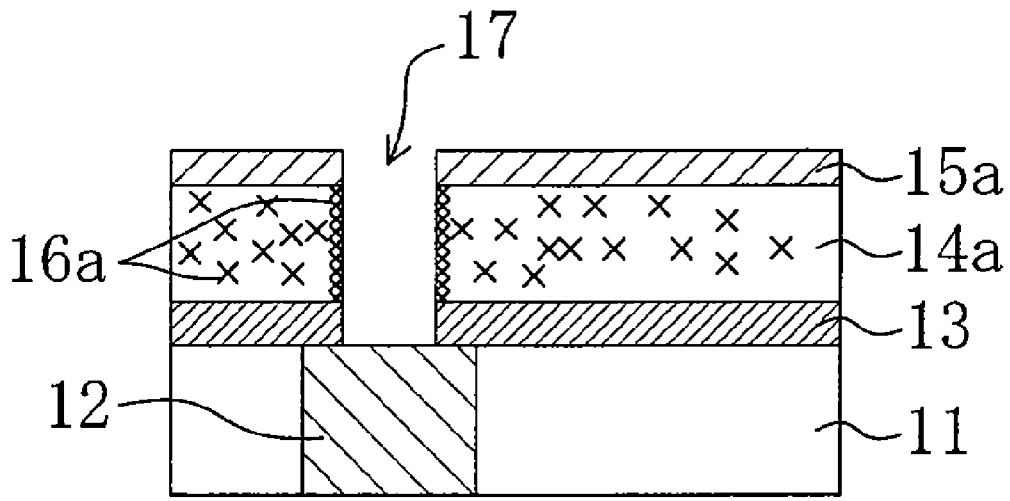
FIGS. 6A and 6B are diagrams illustrating a method for manufacturing a semiconductor device according to a second embodiment of the present invention.
Figure 6B:
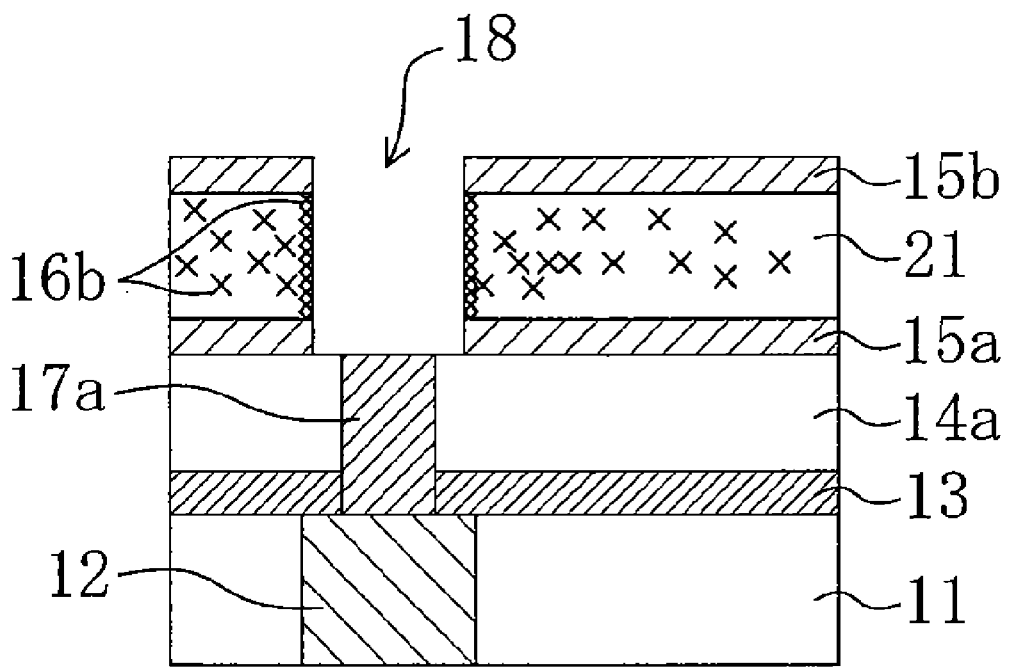

Hereinafter, a method for manufacturing a semiconductor device according to a second embodiment of the present invention will be described. FIGS. 6A and 6B are diagrams illustrating the method for manufacturing a semiconductor device according to the second embodiment. In the second embodiment, description will be given to the case where a multilayer wiring structure made of Cu or the like is formed by using a single damascene method. Only the differences from the first embodiment will be described herein briefly.

As shown in FIG. 6A, an interlayer insulating film 11 made of, for example, an NSG film, is formed over a semiconductor substrate (not shown) having required semiconductor elements formed thereon. A lower wiring 12 made of Cu or the like is then formed in the interlayer insulating film 11. An etching stopper film 13 and a first low dielectric constant film 14a are then sequentially formed over the lower wiring 12 and the interlayer insulating film 11. A cap film 15a is then formed on the first low dielectric constant film 14a. A resist pattern for forming a via plug is formed by lithography on the cap film 15a. By using the resist pattern as a mask, etching is performed to form a via hole 17 extending through the cap film 15a, the first low dielectric constant film 14a, and the etching stopper film 13. FIG. 6A shows a state in this stage.

As a result of forming the via hole 17, film damages 16a have been generated in the first low dielectric constant film 14a due to the processes such as etching and ashing. The film damages 16a of the first low dielectric constant film 14a can be recovered by performing silylation according to the method of the first embodiment of the present invention.

As shown in FIG. 6B, a metal film such as Cu is formed in the via hole 17 to form a via plug 17a. A second low dielectric constant film 21 and a cap film 15b are then sequentially formed over the via plug 17a and the cap film 15a. A resist pattern for forming a trench is then formed by lithography on the cap film 15b. By using the resist pattern as a mask, etching is performed to form a trench groove 18 extending through the cap films 15a, 15b and the second low dielectric constant film 21 and reaching the top surface of the via plug 17a.

As a result of forming the trench groove 18, film damages 16b have been generated in the second low dielectric constant film 21 by the processes such as etching and ashing, as in the case of forming the via hole 17. The film damages 16b in the second low dielectric constant film 21 can be recovered by performing the damage recovering process of the first embodiment shown in FIGS. 2C through 2E.

Although not shown in the figures, an upper wiring connected to the lower wiring 12 through the via plug 17a can be formed by embedding a metal film such as Cu in the trench 18.

The semiconductor device of the present embodiment is characterized in that the via plug and the wirings are sequentially repeatedly formed by a single damascene method and in that the organic solution and the silylating solution are sequentially supplied to the first low dielectric constant film 14a and the second low dielectric constant film 21 after formation of the via hole 17 and the trench 18 in order to perform silylation. When the first low dielectric constant film 14a is silylated, the silylating solution is supplied after the organic solution is applied. This improves penetration of the silylating solution into the first low dielectric constant film 14a. As a result, the silylating solution reaches the fine pores in the low dielectric constant film, whereby the film damages can be efficiently repaired in the whole first low dielectric constant film 14a. Accordingly, in the manufacturing method of the semiconductor device of the present embodiment, even if film damages are generated in the first low dielectric constant film 14a and the second low dielectric constant film 21 by the processes such as etching and ashing performed to form the via hole 17 and the trench 18, the film recovering process is performed after every process that generates the film damages. A low dielectric constant film having more reliably suppressed film damages can thus be obtained. According to the manufacturing method of the semiconductor device of the present embodiment, a high quality low dielectric constant film is obtained, and the wiring resistance and the insulating film capacity are reduced, thereby implementing a reliable semiconductor device capable of operating at a high speed even when the semiconductor device is reduced in dimensions.

Third Embodiment

Figure 7:
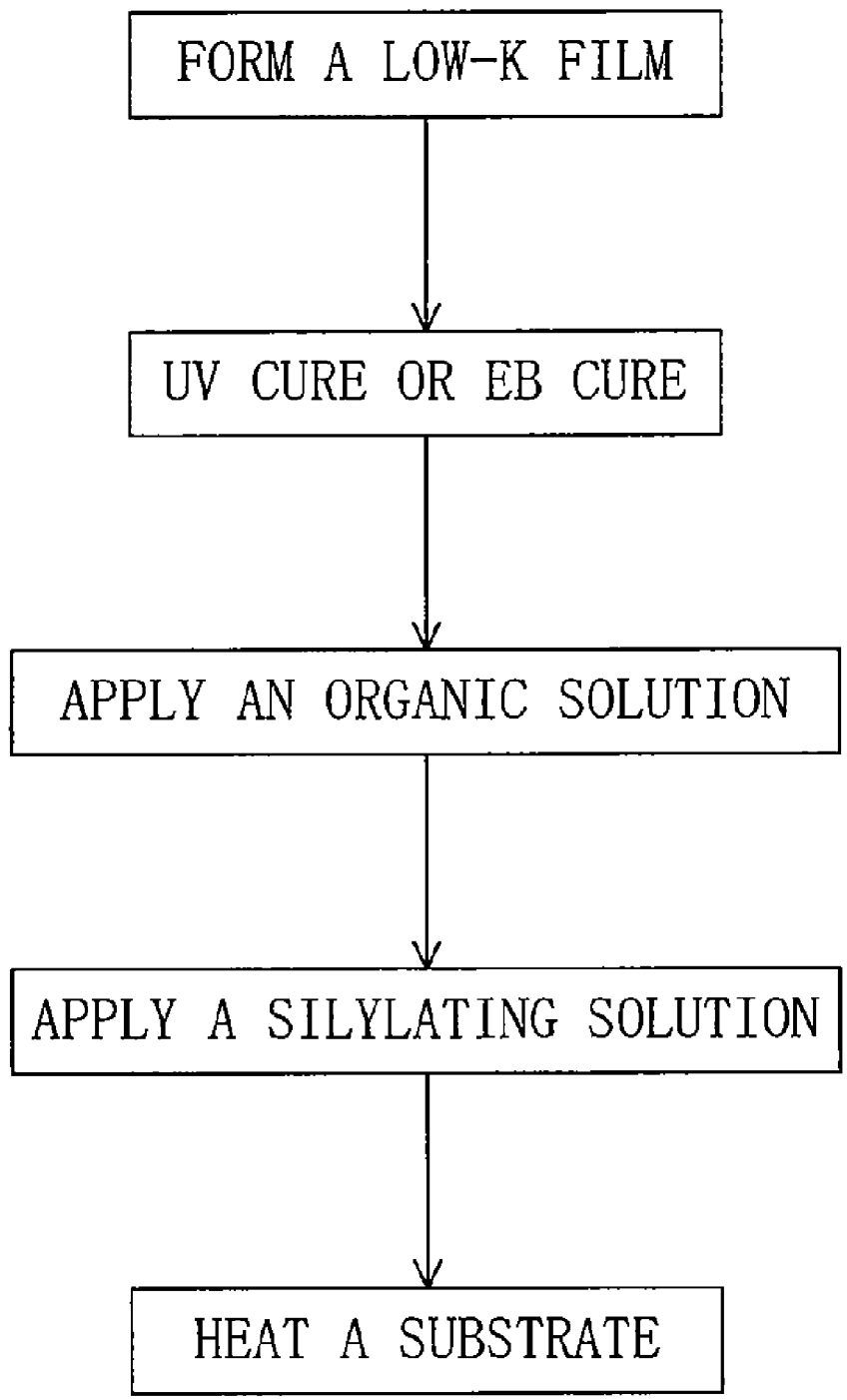
FIG. 7 shows a process sequence according to a method for manufacturing a semiconductor device according to a third embodiment of the present invention.

Hereinafter, a method for manufacturing a semiconductor device according to a third embodiment of the present invention will be described. FIG. 7 shows a process sequence according to the manufacturing method of the semiconductor device of the third embodiment. In the third embodiment, a porous SiOC film is used as an example.

As shown in FIG. 7, a low dielectric constant insulating film (low dielectric constant film) is first formed on a semiconductor substrate having required semiconductor elements formed thereon. The low dielectric constant film is then reformed (UV cure or EB cure) by applying UV beams or electron beams (EB) to the semiconductor substrate while heating the semiconductor substrate. Although this reforming process increases the mechanical strength of the low dielectric constant film, film damages are generated in the low dielectric constant film. These film damages are dangling bonds, Si—H, and Si—OH formed at terminal ends of the low dielectric constant film during the UV cure or EB cure process, and these film damages increase the dielectric constant of the low dielectric constant film. The film damages in the low dielectric constant film can be recovered by performing the damage recovering process shown in the first embodiment.

As in the manufacturing method of the semiconductor device of the first embodiment, a metal wiring (lower wiring) and the like may be formed after formation of the low dielectric constant film. Although detailed description is omitted, a metal wiring is formed by, for example, forming a via hole and a trench in the low dielectric constant film and embedding a metal film in the via hole and the trench. The semiconductor device of the present embodiment can be manufactured by further performing a predetermined process.

The manufacturing method of the semiconductor device of the present embodiment is characterized in that an organic solution and a silylating solution are sequentially supplied to the low dielectric constant film after the UV cure or EB cure in order to perform silylation. When the low dielectric constant film is silylated, the silylating solution is supplied after the organic solution is applied. This improves penetration of the silylating solution into the low dielectric constant film, whereby the film damages of the low dielectric constant film can be efficiently repaired. The manufacturing method of the semiconductor device of the present embodiment can thus implement a reliable semiconductor device having excellent characteristics and having a low dielectric constant film with higher mechanical strength and suppressed film damages as compared to conventional examples.

Figure 8A:
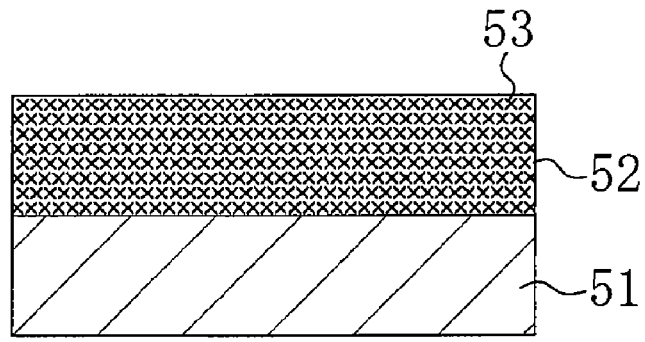
FIGS. 8A, 8B, and 8C are cross-sectional views showing effects of the method for manufacturing a semiconductor device according to the third embodiment of the present invention.
Figure 8B:
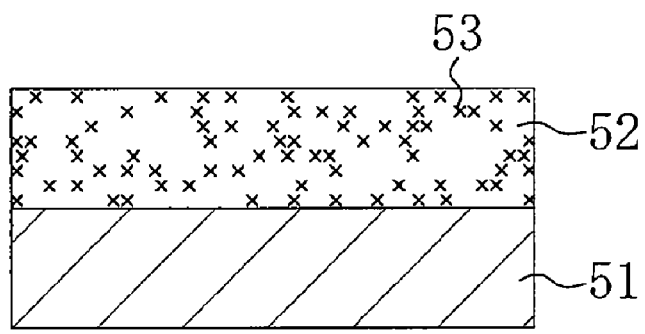
Figure 8C:
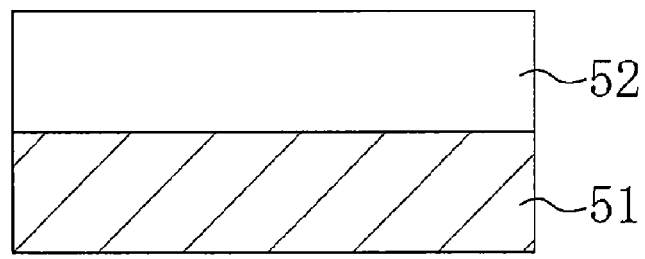

FIGS. 8A through 8C are cross-sectional views showing effects of the manufacturing method of the semiconductor device of the present embodiment. FIG. 8A is a cross-sectional view showing the low dielectric constant film after the UV cure or EB cure. FIG. 8B is a cross-sectional view showing the low dielectric constant film after the silylation of supplying the silylating solution and heating is performed after the UV cure or EB cure. FIG. 8C is a cross-sectional view showing the low dielectric constant film after the damage recovering process according to the manufacturing method of the semiconductor device of the present embodiment is performed after the UV cure or EB cure. As shown in FIG. 8A, damages 53 have been generated in the low dielectric constant film 52 after the UV cure or EB cure. In the case where only the silylation is performed on the low dielectric constant film 52, the film damages 53 at the surface of the low dielectric constant film 52 are relatively recovered, but the film damages 53 inside the low dielectric constant film 52 still remain as shown in FIG. 8B. However, in the manufacturing method of the semiconductor device of the present embodiment, the organic solution is supplied in advance so that the silylating agent can sufficiently penetrate into the low dielectric constant film. Accordingly, the film damages in the low dielectric constant film 52 can be more reliably recovered as shown in FIG. 8C.

The manufacturing method of the semiconductor device of the present embodiment is characterized in that, in the process of recovering the damages generated by the UV cure or EB cure, the organic solution is supplied to the low dielectric constant film 52 before silylation of the low dielectric constant film 52. Although the damages in the first embodiment are generated by the process of forming the recess, the damages in the third embodiment are generated by the UV cure or EB cure performed to improve the mechanical strength of the low dielectric constant film. However, the damage recovering process of the present invention is essentially the same in the first and third embodiments.

As described above, the film damages are recovered by replacing the terminal ends of the low dielectric constant film 52 with a part of the silylating agent by silylation. Since a porous film is used as the low dielectric constant film 52, the low dielectric constant film 52 has a reduced k value. When the pore diameter is reduced to about 2 to 3 nm or less, the silylating solution is less likely to reach the pores in the low dielectric constant film 52, hindering efficient silylation. In the manufacturing method of the semiconductor device of the present embodiment, the organic solution is supplied before silylation of the low dielectric constant film 52 so that the silylating solution can penetrate into the fine pores in the low dielectric constant film 52. As a result, silylation can be performed more efficiently as compared to the case where the organic solution is not supplied. As a result, a high quality low dielectric constant film having suppressed film damages can be obtained, and the wiring resistance and the insulating film capacity are suppressed, thereby implementing a reliable semiconductor device capable of operating at a high speed even when the semiconductor device is reduced in dimensions.

Note that in the case where the organic solution in the low dielectric constant film is evaporated between the organic solution applying step and the silylating solution applying step, one or more materials selected from, for example, alcohols, ketones, ethers, esters, and hydrocarbons may be used as the organic solution.

Figure 9:
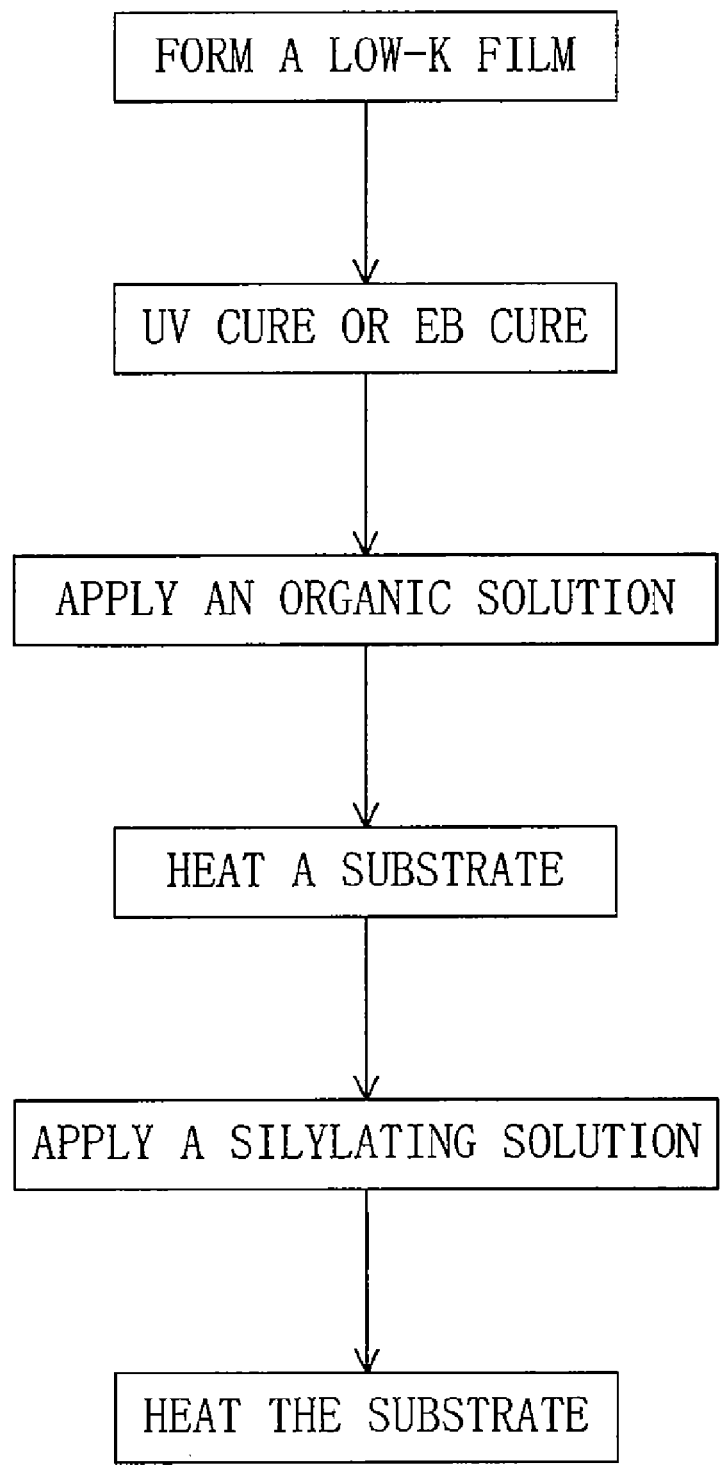
FIG. 9 shows a process sequence according to a modification of the method for manufacturing a semiconductor device according to the third embodiment of the present invention.
Figure 10:
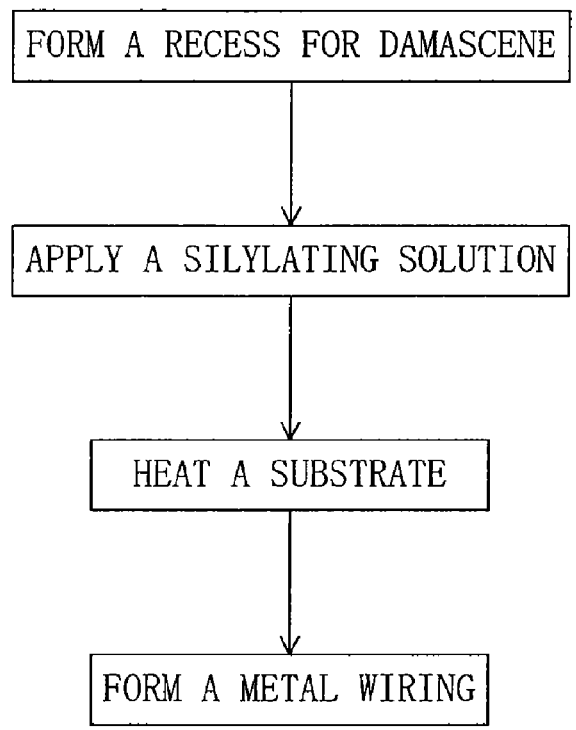
FIG. 10 shows a process sequence according to a conventional method for manufacturing a semiconductor device.
Figure 11:
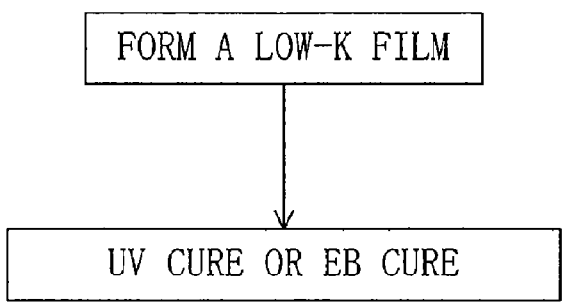
FIG. 11 shows a process sequence according to a conventional method for manufacturing a semiconductor device.

In the manufacturing method of the semiconductor device of the present embodiment, a rotation drying step may be added between the organic solution applying step and the silylating solution applying step. In this case, the silylating solution can be easily applied after the organic solution in the low dielectric constant film is evaporated. In order to more reliably evaporate the organic solution, a heating step may be added after the organic solution is applied to the low dielectric constant film. This process sequence is shown in FIG. 9. FIG. 9 shows a process sequence according to a modification of the manufacturing method of the semiconductor device of the present embodiment. As shown in FIG. 9, the modification of the manufacturing method of the semiconductor device of the present embodiment is characterized in that the substrate heating step is added between the organic solution applying step and the silylating solution applying step.

In the modification of the manufacturing method of the semiconductor device of the present embodiment, a residual organic substance and moisture in the pores are also evaporated when the organic solution in the pores of the low dielectric constant film is evaporated in both the rotation drying step and the heating step. Accordingly, in the subsequent step of applying the silylating solution, the silylating solution can penetrate into the fine pores formed deep inside the low dielectric constant film without being hindered by the moisture and the residue in the pores. For example, isopropyl alcohol or a solution containing at least isopropyl alcohol is easy to handle and has an excellent penetration property into the fine pores formed deep inside the low dielectric constant film. In the case where the substrate is heated after application of the organic solution, an unnecessary residual organic component and moisture remaining in the pores can also be efficiently evaporated simultaneously. According to the modification of the manufacturing method of the semiconductor device of the present embodiment, a low dielectric constant film with excellent capability is obtained and the wiring resistance and the insulating film capacity are suppressed, thereby implementing a reliable semiconductor device capable of operating at a high speed even when the semiconductor device is reduced in dimensions.

Description will now be given to the case where the silylating solution applying step is performed before the organic solution applied in the organic solution applying step dries in the manufacturing method of the semiconductor device of the present embodiment. In this case, the silylating solution is applied to the substrate surface having the organic solution thereon, the silylating agent in the silylating solution penetrates into the fine pores formed deep inside the low dielectric constant film in the mixed state of the organic solution and the silylating solution. According to the manufacturing method of the semiconductor device of the present embodiment, a low dielectric constant film with excellent capability is obtained and the wiring resistance and the insulating film capacity are suppressed, thereby implementing a reliable semiconductor device capable of operating at a high speed even when the semiconductor device is reduced in dimensions.

In this case, the organic solution has a function to assist penetration of the silylating solution into the pores so that the silylating solution can efficiently reach the fine pores of the low dielectric constant film. It is therefore desirable to use a solvent contained in the silylating solution or a chemically stable solution that is soluble in this solvent and is not reactive with the silylating agent as the organic solution. In this case, it is desirable to use at least one selected from ketones, ethers, esters, and hydrocarbons as the solvent of the silylating solution.

Note that a porous SiOC film is used in the manufacturing method of the semiconductor device of the present invention. However, an organic film or an inorganic film may be used instead of the porous SiOC film, and the same effects can be obtained even when an organic film or an inorganic film is used.

As has been described above, according to the manufacturing method of the semiconductor device of the present embodiment, a low dielectric constant film having high mechanical strength is obtained, and the wiring resistance and the insulating film capacity are suppressed, thereby implementing a reliable semiconductor device capable of operating at a high speed.

The manufacturing method of the semiconductor device according to the present invention as described above is useful to improve, for example, the operation speed and reliability of semiconductor devices.

The description of the embodiments of the present invention is given above for the understanding of the present invention. It will be understood that the invention is not limited to the particular embodiments described herein, but is capable of various modifications, rearrangements, and substitutions as will now become apparent to those skilled in the art without departing from the scope of the invention. Therefore, it is intended that the following claims cover all such modifications and changes as fall within the true spirit and scope of the invention.

What is claimed is:

1. A method for manufacturing a semiconductor device, comprising the steps of:
    (a) forming a low dielectric constant film over a substrate, said low dielectric constant film having a pore;
    (b) forming a recess in the low dielectric constant film;
    (c) after the step (b), sequentially performing the steps of (c1) applying an organic solution to the low dielectric constant film and (c2) silylating the low dielectric constant film with a silylating solution such that the silylating solution reaches the pore; and
    (d) after the step (c), embedding a metal in the recess to form at least one of a via plug and a metal wiring in the low dielectric constant film.

2. The method according to claim 1, wherein the step (c2) further includes the step of heating the substrate after applying the silylating solution to the low dielectric constant film.

3. The method according to claim 1, wherein the step (c1) further includes the step of heating the substrate after applying the organic solution to the low dielectric constant film.

4. The method according to claim 1, wherein, in the step (c), the step (c2) is performed before the organic solution applied in the step (c1) dries.

5. The method according to claim 1, wherein the step (b) is any one of etching, aching, and cleaning.

6. The method according to claim 1, wherein the organic solution is a solvent contained in the silylating solution or a solution which is soluble in the solvent contained in the silylating solution and which is chemically stable with a silylating agent.

7. The method according to claim 1, wherein the organic solution contains at least one alcohol.

8. The method according to claim 1, wherein the organic solution is isopropyl alcohol or a solution containing at least isopropyl alcohol.

9. The method according to claim 1, wherein the organic solution is made by using at least one of ketones, ethers, esters, and hydrocarbons.

10. The method according to claim 1, wherein
the step (a) includes the steps of (a1) forming a first low dielectric constant film over the substrate and (a2) forming a second low dielectric constant film over the first low dielectric constant film,
the step (b) includes the steps of (b1) forming a part of the recess in the first low dielectric constant film and (b2) forming another part of the recess in the second low dielectric constant film,
the step (d) includes the steps of (d1), before the step (a2), embedding a metal in the part of the recess formed in the step (b1) to form the via plug in the first low dielectric constant film and (d2) embedding a metal in the part of the recess formed in the step (b2) to form the metal wiring in the second low dielectric constant film, thereby forming a wiring of a layer, and
the step (c) is performed after at least one of the steps (b1) and (b2).

11. The method according to claim 1, wherein the recess formed in the low dielectric constant film is formed by a via hole and a wiring groove connecting to the via hole, the via plug and the metal wiring are simultaneously formed by embedding a metal in the recess, and the step (c) is performed after at least one of etching, ashing, and cleaning performed to form the recess.

12. The method according to claim 1, further comprising steps of:
(e) applying light or electron beams to the low dielectric constant film after the step (a) and before the step (b); and
(f) after the step (e) and before the step (b), sequentially performing the steps of (f1) applying an organic solution to the low dielectric constant film and (f2) silylating the low dielectric constant film with a silylating solution.

13. The method according to claim 1, wherein said pore has a diameter of about 2 nm or more to 3 nm or less.

* * * * *